(12) United States Patent
Chen

(10) Patent No.: US 11,715,753 B2
(45) Date of Patent: Aug. 1, 2023

(54) METHODS FOR INTEGRATION OF LIGHT EMITTING DIODES AND IMAGE SENSORS

(71) Applicant: Applied Materials, Inc., Santa Clara, CA (US)

(72) Inventor: Taichou Papo Chen, San Jose, CA (US)

(73) Assignee: APPLIED MATERIALS, INC., Santa Clara, CA (US)

( * ) Notice: Subject to any disclaimer, the term of this patent is extended or adjusted under 35 U.S.C. 154(b) by 23 days.

(21) Appl. No.: 17/137,606

(22) Filed: Dec. 30, 2020

(65) Prior Publication Data

US 2022/0208828 A1 Jun. 30, 2022

(51) Int. Cl.
*H01L 27/146* (2006.01)
*H01L 25/18* (2023.01)

(52) U.S. Cl.
CPC ........ *H01L 27/14683* (2013.01); *H01L 25/18* (2013.01); *H01L 27/14678* (2013.01)

(58) Field of Classification Search
CPC ......... H01L 27/14683; H01L 27/14678; H01L 25/18
USPC .......................................................... 438/24
See application file for complete search history.

(56) References Cited

U.S. PATENT DOCUMENTS

| | | | |
|---|---|---|---|
| 6,177,289 B1 * | 1/2001 | Crow | ................... H01L 31/105 438/16 |
| 9,236,502 B2 | 1/2016 | Tischler | |
| 9,716,082 B2 | 7/2017 | Bower et al. | |
| 10,964,581 B1 * | 3/2021 | Torrents Abad | .... H01L 21/6835 |
| 2005/0127275 A1 * | 6/2005 | Yang | ................... H01L 31/1055 250/214 R |
| 2007/0138460 A1 * | 6/2007 | Choi | ..................... H01L 51/502 257/13 |
| 2008/0251872 A1 * | 10/2008 | Kwon | ..................... H01L 24/97 257/432 |
| 2010/0032700 A1 * | 2/2010 | Yu | ............................ H01L 33/24 257/98 |
| 2010/0040991 A1 * | 2/2010 | Chung | ............... H01L 21/6776 432/1 |

(Continued)

FOREIGN PATENT DOCUMENTS

| | | |
|---|---|---|
| JP | 2006-278368 A | 10/2006 |
| WO | WO 2017156890 | * 9/2017 |

OTHER PUBLICATIONS

International Search Report and Written Opinion for PCT/US2021/064852 dated Apr. 18, 2022.

*Primary Examiner* — Sheng-Bai Zhu
(74) *Attorney, Agent, or Firm* — Moser Taboada

(57) ABSTRACT

Methods for integrating an image sensor and a light emitting diode (LED) leverage conformal depositions to achieve a single-sided, same height arrangement of contacts. In some embodiments, the method includes forming a plurality of cavities on a substrate where the plurality of cavities have a cavity profile and are configured to accept an emitter pixel structure or a sensor pixel structure, forming an emitter pixel structure in a cavity on the substrate where the emitter pixel structure is configured to have a plurality of exposed direct emitter contact areas on a same side and at a same height, and forming at least one sensor pixel structure in a cavity on the substrate where the sensor pixel structure is configured to have a plurality of exposed direct sensor contact areas on a same side and at a same height.

20 Claims, 13 Drawing Sheets

(56) References Cited

U.S. PATENT DOCUMENTS

| | | | |
|---|---|---|---|
| 2010/0079050 A1* | 4/2010 | Kamamori | H01L 33/62 |
| | | | 313/113 |
| 2010/0173449 A1 | 7/2010 | Cheng et al. | |
| 2012/0235216 A1* | 9/2012 | Anderson | H01L 29/66545 |
| | | | 257/294 |
| 2012/0305771 A1* | 12/2012 | Lai | G01S 7/4813 |
| | | | 250/338.4 |
| 2016/0093600 A1 | 3/2016 | Bower et al. | |
| 2016/0245701 A1* | 8/2016 | Yon | G01J 5/20 |
| 2018/0254382 A1 | 9/2018 | Dupont et al. | |
| 2018/0261584 A1 | 9/2018 | Dupont et al. | |
| 2019/0148598 A1 | 5/2019 | Bower et al. | |
| 2020/0295100 A1* | 9/2020 | Liu | H01L 51/5253 |

\* cited by examiner

METHODS FOR INTEGRATION OF LIGHT EMITTING DIODES AND IMAGE SENSORS

FIELD

Embodiments of the present principles generally relate to semiconductor manufacturing.

BACKGROUND

In some applications, the use of photodiodes or image sensors along with light emitting diodes (LEDs) allows for functionality that is not possible using either one of the technologies individually. The integration of the technologies, especially during manufacturing, is complex and costly. For example, photodiodes are typically constructed using implantation techniques that require many dopant (sometimes 30 or more) treatments at different energy levels to form pixels. The complex dopant processes result in low throughput which yields a higher cost per unit manufactured. LEDs on the other hand are typically formed using patterning techniques that create multi-level contact formations that are difficult to integrate with photodiodes without additional complex redistribution layers formed during back end of the line (BEOL) packaging processes.

Accordingly, the inventor has provided methods for integrating image sensors and LEDs that dramatically increase the manufacturing throughput and are compatible with more workflows such as complementary metal oxide semiconductor (CMOS) workflows, leading to semiconductor packaging not previously achievable and with substantially reduced manufacturing costs and superior performance.

SUMMARY

Methods for integrating light emitting diodes (LEDs) and image sensors are provided herein.

In some embodiments, a method for integrating an image sensor and a light emitting diode (LED) may comprise forming a plurality of cavities on a substrate, the plurality of cavities having at least one cavity profile and configured to accept an emitter pixel structure of the LED or a sensor pixel structure of the image sensor, forming at least one emitter pixel structure in at least a first one of the plurality of cavities on the substrate, wherein the at least one emitter pixel structure is configured to have a plurality of exposed direct contact areas on a same side and at a same height, and forming at least one sensor pixel structure in at least a second one of the plurality of cavities on the substrate, wherein the at least one sensor pixel structure is configured to have a plurality of exposed direct contact areas on a same side and at a same height.

In some embodiments, the method may further include forming contacts on the at least one emitter pixel structure on the plurality of exposed direct contact areas and forming contacts on the at least one sensor pixel structure on the plurality of exposed contact areas, forming a redistribution layer on the substrate and interconnecting at least one driver circuit to the at least one emitter pixel structure via the redistribution layer to control at least one of the at least one emitter pixel structure of the LED, forming a redistribution layer on the substrate and interconnecting at least one readout circuit to the at least one sensor pixel structure via the redistribution layer to control at least one of the at least one sensor pixel structure of the image sensor, planarizing a bottom surface of the substrate to expose a bottom area of the at least one emitter pixel structure or the at least one sensor pixel structure, forming a mold layer on the substrate and forming the plurality of cavities on the substrate by etching plurality of cavities in the mold layer, forming the plurality of cavities on the substrate by etching plurality of cavities into a substrate material, forming the at least one emitter pixel structure using an atomic layer deposition (ALD) process, a chemical vapor deposition (CVD) process, or a molecular beam epitaxy (MBE) process and crystallizing the at least one emitter pixel structure, and/or forming the at least one sensor pixel structure using an atomic layer deposition (ALD) process, a chemical vapor deposition (CVD) process, or a molecular beam epitaxy (MBE) process and crystallizing the at least one sensor pixel structure.

In some embodiments, a method for integrating an image sensor and a light emitting diode (LED) may comprise forming a hardmask pattern on a substrate, forming a plurality of cavities on the substrate based on the hardmask pattern, the plurality of cavities having at least one cavity profile and configured to accept an emitter pixel structure of the LED or a sensor pixel structure of the image sensor, forming at least one conformal emitter pixel structure in at least a first one of the plurality of cavities on the substrate, wherein the at least one conformal emitter pixel structure is configured to have a plurality of exposed direct contact areas on a same side and at a same height, forming at least one conformal sensor pixel structure in at least a second one of the plurality of cavities on the substrate, wherein the at least one conformal sensor pixel structure is configured to have a plurality of exposed direct contact areas on a same side and at a same height, forming contacts on the at least one conformal emitter pixel structure on the plurality of exposed direct contact areas, and forming contacts on the at least one conformal sensor pixel structure on the plurality of exposed contact areas.

In some embodiments, the method may further include forming a mold layer on the substrate and forming the plurality of cavities on the substrate by etching plurality of cavities in the mold layer, forming the plurality of cavities on the substrate by etching plurality of cavities into a substrate material, forming the at least one conformal emitter pixel structure using an atomic layer deposition (ALD) process, a chemical vapor deposition (CVD) process, or a molecular beam epitaxy (MBE) process, and crystallizing the at least one conformal emitter pixel structure, forming the at least one conformal sensor pixel structure using an atomic layer deposition (ALD) process, a chemical vapor deposition (CVD) process, or a molecular beam epitaxy (MBE) process and crystallizing the at least one conformal sensor pixel structure, forming a redistribution layer on the substrate, interconnecting at least one driver circuit to the at least one conformal emitter pixel structure via the redistribution layer to control at least one of the at least one conformal emitter pixel structure of the LED, and interconnecting at least one readout circuit to the at least one conformal sensor pixel structure via the redistribution layer to control at least one of the at least one conformal sensor pixel structure of the image sensor, and/or wherein the at least one driver circuit or the at least one readout circuit is formed in a substrate material adjacent to the at least one conformal emitter pixel structure or adjacent to the at least one conformal sensor pixel structure.

In some embodiments, a non-transitory, computer readable medium having instructions stored thereon that, when executed, cause a method for integrating an image sensor and a light emitting diode (LED) to be performed, the method may comprise forming a plurality of cavities on a substrate, the plurality of cavities having at least one cavity profile and configured to accept an emitter pixel structure of the LED or a sensor pixel structure of the image sensor, forming at least one emitter pixel structure in at least a first one of the plurality of cavities on the substrate, wherein the at least one emitter pixel structure is configured to have a plurality of exposed direct contact areas on a same side and at a same height, and forming at least one sensor pixel structure in at least a second one of the plurality of cavities on the substrate, wherein the at least one sensor pixel structure is configured to have a plurality of exposed direct contact areas on a same side and at a same height.

In some embodiments, the method may further include wherein the at least one cavity profile includes a first cavity profile for the at least one emitter pixel structure and a second cavity profile for the at least one sensor pixel structure, forming the at least one emitter pixel structure using an atomic layer deposition (ALD) process, a chemical vapor deposition (CVD) process, or a molecular beam epitaxy (MBE) process or forming the at least one sensor pixel structure using an atomic layer deposition (ALD) process, a chemical vapor deposition (CVD) process, or a molecular beam epitaxy (MBE) process and crystallizing the at least one emitter pixel structure, forming a mold layer on the substrate and forming the plurality of cavities on the substrate by etching plurality of cavities in the mold layer or forming the plurality of cavities on the substrate by etching plurality of cavities into a substrate material.

Other and further embodiments are disclosed below.

BRIEF DESCRIPTION OF THE DRAWINGS

Embodiments of the present principles, briefly summarized above and discussed in greater detail below, can be understood by reference to the illustrative embodiments of the principles depicted in the appended drawings. However, the appended drawings illustrate only typical embodiments of the principles and are thus not to be considered limiting of scope, for the principles may admit to other equally effective embodiments.

Figure 1:
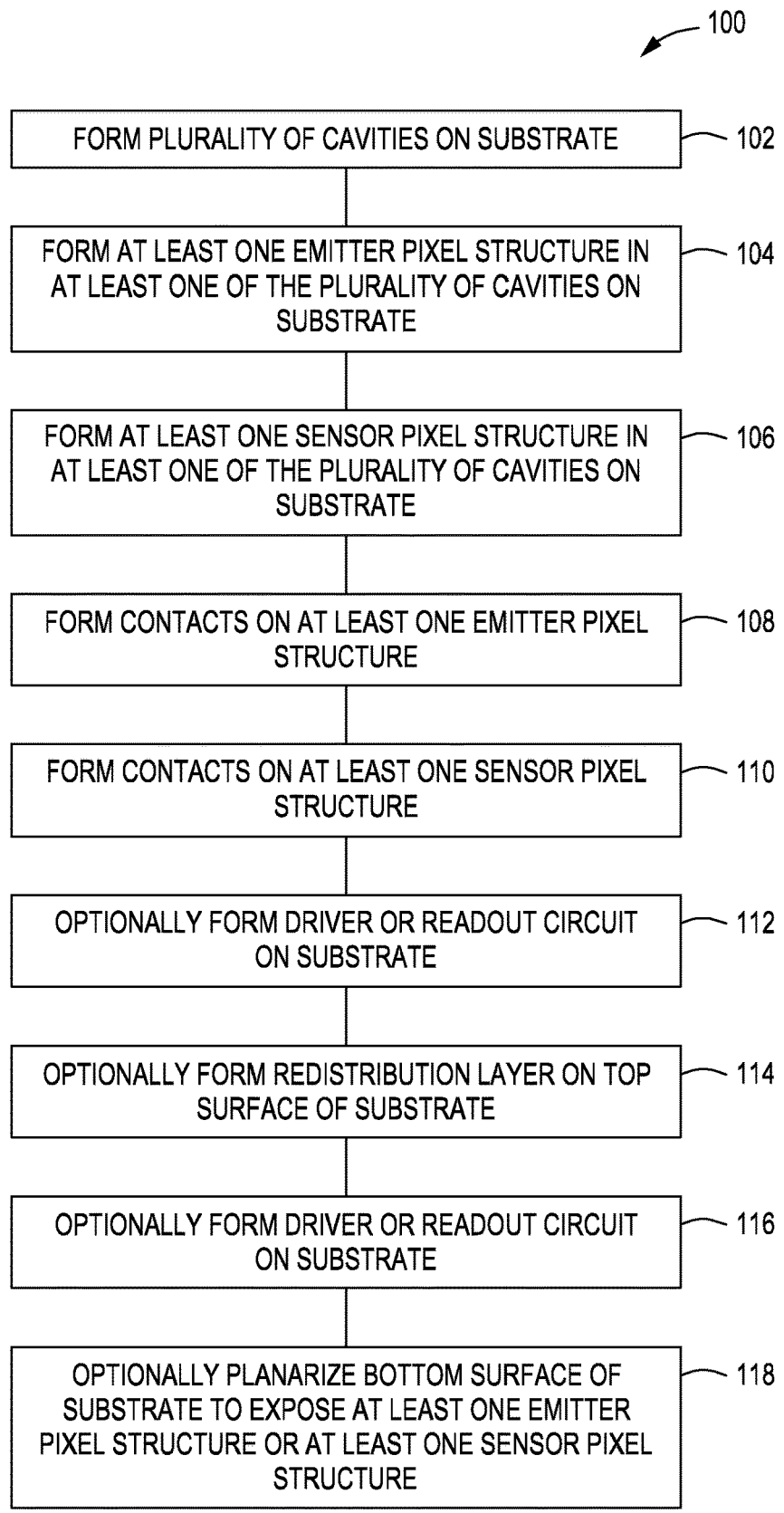
FIG. 1 is a method of LED and image sensor integration in accordance with some embodiments of the present principles.

To facilitate understanding, identical reference numerals have been used, where possible, to designate identical elements that are common to the figures. The figures are not drawn to scale and may be simplified for clarity. Elements and features of one embodiment may be beneficially incorporated in other embodiments without further recitation.

DETAILED DESCRIPTION

The disclosed methods enable integration of light emitting diodes (LEDs) with image sensors with simplified manufacturing workflows while improving the performance and scalability of the integrated technologies. The methods also address the challenges of sensor and emitter chip level integration for emerging markets such as under display cameras (display pixels and camera pixels are integrated together to allow full screen displays without having any "notches" for the camera), augmented reality/virtual reality devices, head up displays (HUDs), medical applications, and the like. The techniques of the present principles also allow for same chip integration of the image sensors and LEDs on the same side of the chip (facing the same direction) or both sides of the chip (facing opposite directions) while eliminating optical interference between the image sensors and LEDs. In conventional approaches, sensors and emitters are fabricated separately by very different processes, substrate types, and wafer sizes. With conventional approaches, the integration is very challenging and difficult to achieve without compromising device performance and form factor space. The methods of the present principles are complementary metal oxide semiconductor (CMOS) compatible and can advantageously enable chip level integration by monolithic or wafer bonding approaches as well as solutions to address optical interference between sensors and emitters.

In some embodiments, a monolithic approach is used to integrate sensors and emitters on a single substrate. Substrate and cavity engineering are performed and then sensor and emitter pixel structures are formed into the cavities on the same substrate. Contact areas on the sensor pixel structures and the emitter pixel structures can be both located on the same side at the same height and easily interconnected using a simple redistribution layer to connect to driver and readout circuitry. If backside illumination (BSI) is desired, the backside of the substrate can be thinned out. Optical layers can also be formed to better isolate pixels and also emitter pixels from sensor pixels. In some embodiments, a packaging approach is used to integrate sensors and emitters by forming the sensor pixel structures and emitter pixel structures on separate substrates. Because of the same side and at the same height contact areas, both substrates use a simple redistribution layer to form contact points for integration on each substrate top surface. Optical layers may also be formed for pixel by pixel isolation and/or sensor and emitter isolation. The two top surfaces of the substrates are then bonded together and integrated (e.g., with hybrid bonding, through silicon vias, etc.). Additional etching may form openings to allow emitter light out or sensor light in. The openings may also be coated with a sidewall mirror to improve the emitter or sensor's performance. Substrate thinning can also be applied in which the sensor and emitter surfaces are both exposed but facing opposite sides. By implementing substrate and cavity engineering, the methods of the present principles bring process similarity between sensor pixel structure and emitter pixel structure fabrications, which is not only CMOS compatible but also friendly for chip level integration by either monolithic or bonding approaches.

An example method 100 is depicted in FIG. 1 with reference to FIGS. 3-20. In block 102, a plurality of cavities 1604 is formed on a substrate as depicted in a view 1600A of FIG. 16. The phrase "formed on a substrate" as used herein includes cavities that are etched into the substrate material as well as cavities that are formed in a layer of mold material on an upper surface of the substrate (herein, the substrate material or the mold layer will be referred to as "the cavity layer" for the sake of brevity). The substrate may be a silicon-based material and the like. The formation of the plurality of cavities 1604 formed in the cavity layer 1602 of FIG. 16 may be accomplished using a substrate etching process or a mold layer formed on the substrate which is then subsequently etched to form the cavities. For example, in some embodiments, the plurality of cavities 404 may be formed on the substrate 402 by using a patterned hardmask 406 as depicted in a view 400A of FIG. 4. By using an etching process, the substrate 402 is etched away and the plurality of cavities 404 are formed in the substrate 402 as in a view 400B of FIG. 4. The patterned hardmask 406 is then removed leaving the plurality of cavities 404 in the substrate 402 as depicted in a view 400C of FIG. 4. The patterned hardmask 406 can also be kept in support of selective deposition and removed after an emitter pixel structure and/or a sensor pixel structure formation.

Figure 5:
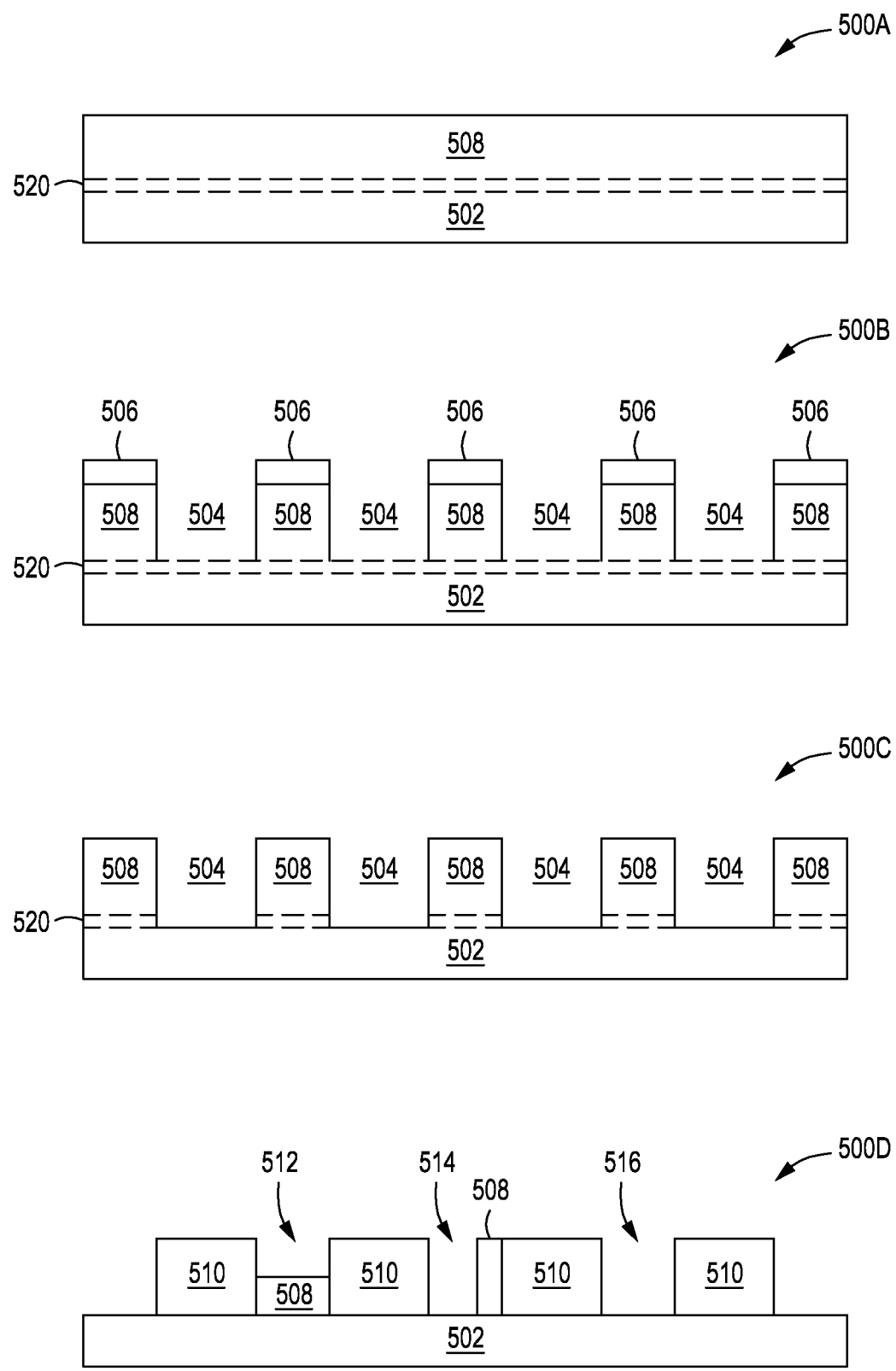
FIG. 5 depicts cavities formed in a mold layer on a substrate in accordance with some embodiments of the present principles.
Figure 6:
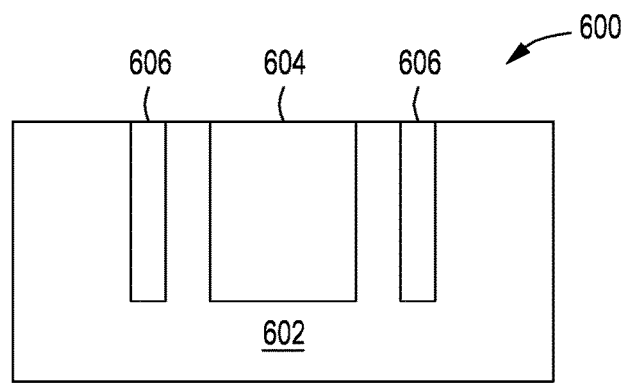
FIG. 6 depicts a cross-sectional view of a cavity surrounded by an external isolation structure in accordance with some embodiments of the present principles.

As an example of the mold layer approach, in some embodiments, the plurality of cavities 504 may be formed by first depositing a mold layer 508 on the substrate 502 as depicted in a view 500A of FIG. 5. The mold layer 508 may be formed of a dielectric or carbon-based material and the like. An etch stop layer 520 is optional and can be added between the mold layer 508 and the substrate 502 as an etching stop layer during cavity formation to protect the surfaces of the substrate 502 exposed during etching from etching damage. The etching stop layer 520 can be removed by selective removal methods which can be a wet or dry process approach. A patterned hardmask 506 may then be applied on the mold layer 508. The patterned hardmask 506 and the mold layer 508 can also be combined as one layer. An etching process is then used to form the plurality of cavities 504 in the mold layer 508 on the substrate 502 as depicted in a view 500B of FIG. 5. The patterned hardmask 506 is then removed leaving the plurality of cavities 504 on the substrate 502 as depicted in a view 500C of FIG. 5. In some embodiments, the mold layer 508 may be removed after formation of the emitter pixel structures and/or the sensor pixel structures 510 as depicted in view 500D of FIG. 5 and as described below.

Figure 3:
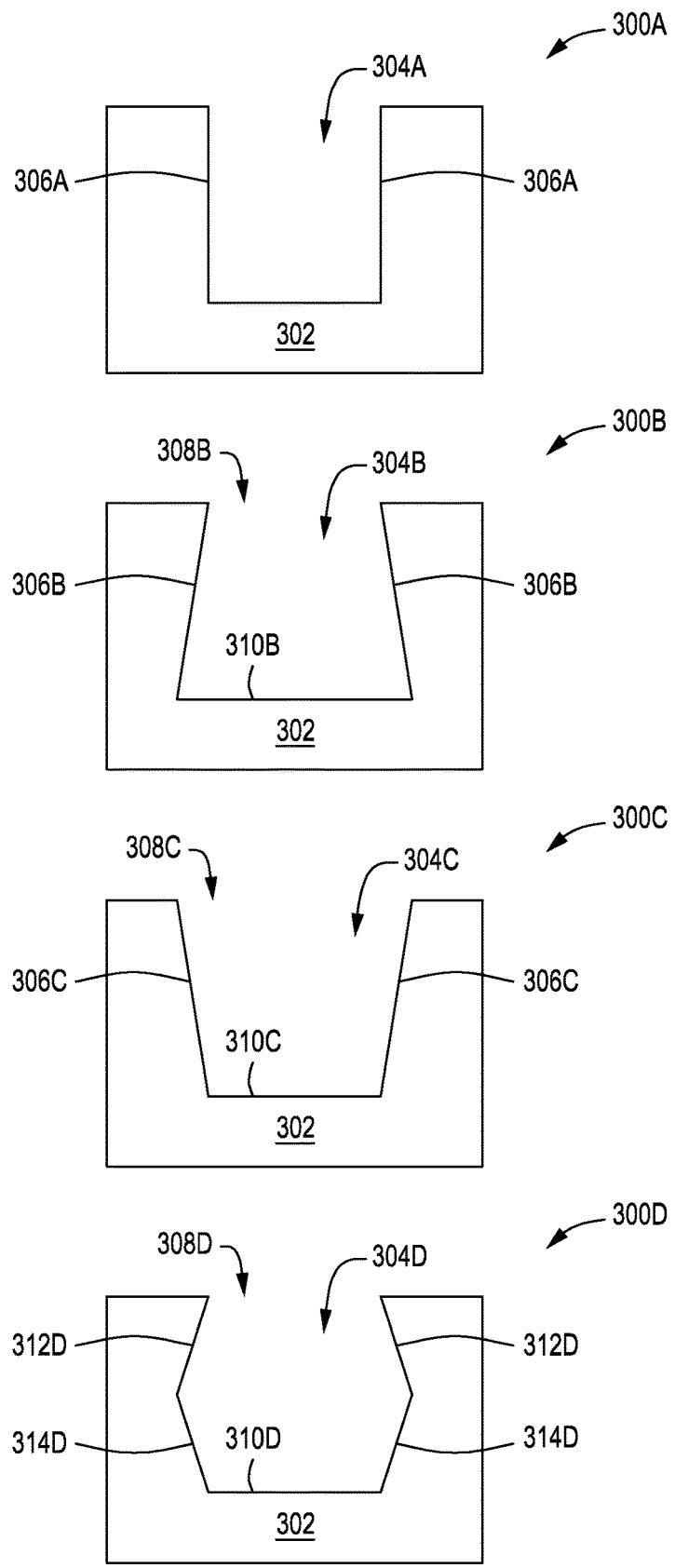
FIG. 3 depicts a cross-sectional view of a cavity with different cavity profiles in accordance with some embodiments of the present principles.
Figure 4:
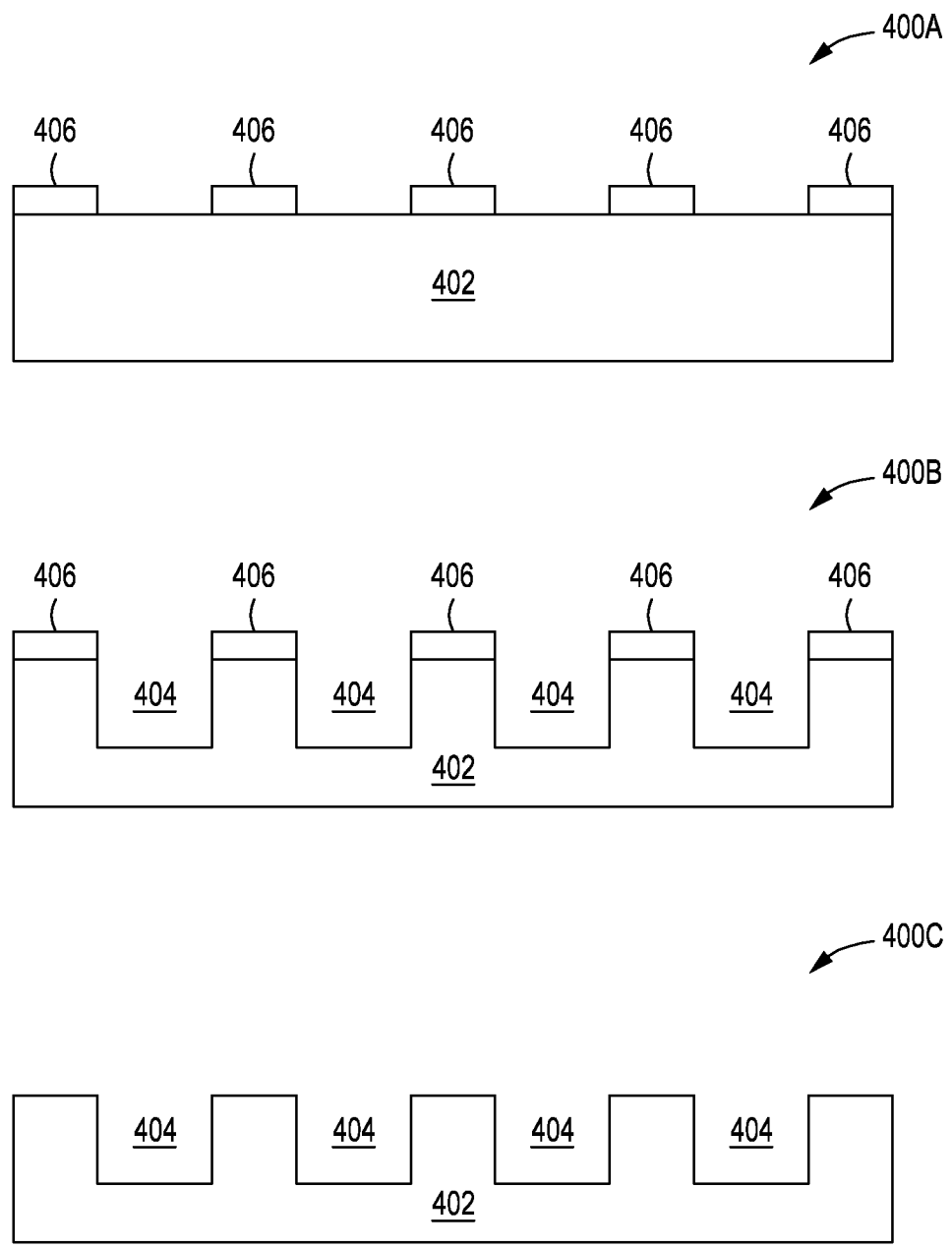
FIG. 4 depicts cavities formed in a substrate material in accordance with some embodiments of the present principles.

As depicted in FIG. 3, cavity engineering may be used to shape the cavity based on a cavity profile that can influence an amount of stress acting on the pixel structure (herein, "pixel structure" may refer to an emitter pixel structure and/or a sensor pixel structure for the sake of brevity) that will be formed inside of the cavity 304A-304D. When a different material is formed inside the substrate material or inside the mold layer stresses and strains will be induced on the different material due to lattice mismatches, stress memory effect (as found in the substrate material cavity or the mold layer cavity approach) and the cavity profile. Herein, "stress" is used to encompass both stresses and strains (compressive and tensile forces) for brevity. In view 300A, a cavity 304A formed in the cavity layer 302 has parallel walls 306A that may exhibit an even amount of stress and/or an electric field from a charge layer throughout the pixel structure. In view 300B, a cavity 304B has angled walls 306B that are closer near a top 308B of the cavity 304B than at a bottom 3106 of the cavity 304B that may exhibit an increased downward stress and/or work-function/electric-field from a charge layer on lower portions of the pixel structure and increased inward stress and/or work-function/electric-field from a charge layer on upper portions of the pixel structure. In view 300C, a cavity 304C has angled walls 306C that are closer near a bottom 310C of the cavity 304C than at a top 308C of the cavity 304C that may exhibit a decreased downward stress and/or work-function/electric-field from a charge layer on lower portions of the pixel structure and decreased inward stress and/or work-function/electric-field from a charge layer on upper portions of the pixel structure. In view 300D, a cavity 304D has inward angled walls 312D in an upper portion of the cavity 304D near the top 308D and outward angled walls 314D in a lower portion of the cavity 304D near the bottom 310D that may exhibit an increased inward stress and/or work-function/electric-field from a charge layer on the upper portion and a downward stress and/or work-function/electric-field from a charge layer on the lower portion that may be counteracted by the outward angled walls 314D. The cavity engineering can be used to influence stresses and/or work-functions/electric-fields from a charge layer on the pixel and structure and also to scale the pixel structure.

The cavity engineering can also be used to streamline the fabrication process by selecting and designing a cavity that requires less intensive processing. One skilled can also appreciate that stresses and/or work-functions/electric-fields from a charge layer within the pixel structure are also impacted by isolation engineering (discussed below). The shape and angles of the walls of the cavity in conjunction with material selection and processing of external isolation structures near the cavity will influence the amount and location of stresses and/or work-functions/electric-fields within the cavity and both may be used to adjust the amount of stress. Shape and angles also enable three-dimensional stresses and/or work-function/electric-field engineering which will enhance quantum efficiency and modulate emission wavelength of emitter pixel structures. The work-function/electric-field engineering of the cavity profile includes altering an electrical field or a work-function within the structure to increase carrier mobility and recombination efficiency and also to adjust an emitted light wavelength of emitter pixel structures. For sensor pixel structures, the shape and angles of the walls of the cavity in conjunction with material selection and processing of external isolation structures near the cavity will influence the amount and location of stresses and/or work-functions/electric-fields within the cavity and both may be used to adjust the amount of stress. Shape and angles also enable three-dimensional stresses and/or work-function/electric-field engineering which will enhance and modulate quantum efficiency at different pixel locations of the sensor pixel structures. The use of angled cavity surface examples is not meant to be limiting. One skilled in the art will also understand that the surfaces that form the cavity may be angled and/or curved.

In the descriptions of the present principles, a cavity having a cavity profile with parallel walls will be used for the sake of brevity, but the parallel walled cavity is not meant to be limiting in any manner. As shown in a view 600 of FIG. 6, at least one external isolation structure is optionally formed near the cavity 604 formed in a cavity layer 602. Herein, the term "external" is used for isolation structures that do not reside within the walls of the cavity 604. The external isolation structures 606 are used to adjust the amount of stress acting on the pixel structure that will be formed within the cavity 604. Formation of external isolation structures immediately after the formation of the cavity is optional because the external isolation structures 606 may be formed prior to and/or after the formation of the pixel structure in the cavity 604 or may not be used at all. The external isolation structures may be, for example but not limited to, shallow trench isolation (STI) structures and/or deep trench isolation (DTI) structures. If the cavity 604 is formed in a mold layer, the mold layer material may be considered an external isolation structure and be adjusted (e.g., material selection such as dielectric or metal materials, dopants, annealing processes, etc.) to produce varying stress levels and force directions on the pixel structure subsequently formed in the cavity 604 (see stress engineering examples below). In some embodiments, the mold layer may be partially removed (see, e.g., nonlimiting examples— upper portion removed 512 or side portion removed 514 and the like of view 500D of FIG. 5) or completely removed (e.g., completely removed 516 of view 500D of FIG. 5) to produce varying stress levels on the emitter pixel structure.

Stress engineering may also be optionally performed after the formation of the cavity. As discussed above, the stress engineering may be performed prior to and/or after the formation of the pixel structure in a cavity. Stress engineering involves altering stresses on a pixel structure to increase the pixel structure's performance by increasing the pixel structure's quantum efficiency. Quantum efficiency, for emitter pixel structures, is the percentage of electrons that are converted into photons that are emitted from the emitter pixel structure. Quantum efficiency, for sensor pixel structures, is the percentage of photons that impinge on the sensor pixel structure that are converted into electrons. The stress and/or work-function/electric-field engineering of the pixel structure may also make use of material selections used to gapfill the trenches or other isolation structures to further influence the amount of stress acting on the pixel structure. The stress can be engineered to be compressive or tensile stress.

Figure 7:
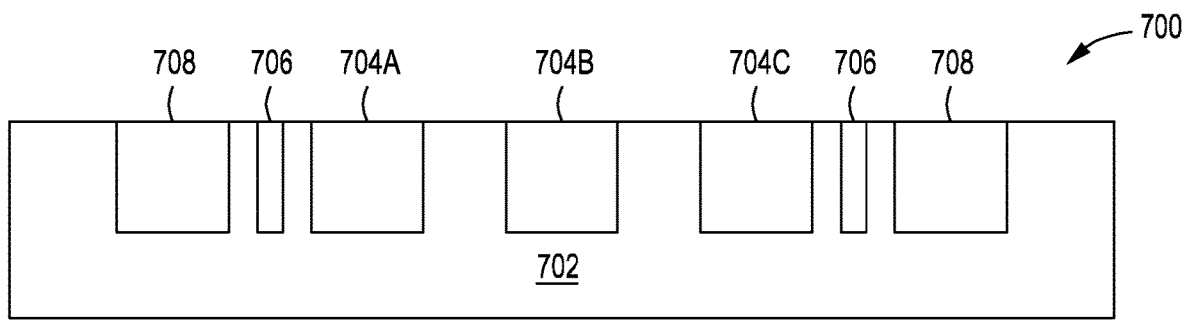
FIG. 7 depicts a cross-sectional view of a plurality of cavities surrounded by an external isolation structure in accordance with some embodiments of the present principles.

The amount of stress can also be even further influenced or adjusted by curing the material in the external isolation structures, implanting dopants into the material in the external isolation structures, and/or annealing of the material in the external isolation structures, etc. The multitude of ways available (including leveraging the cavity engineering as described above) for adjusting the amount of stress acting on the pixel structure allows for infinite levels of stress control (amount of stress, direction of stress forces, etc.) that is not otherwise achievable, yielding substantially higher performances for LEDs and image sensors. Another technique available for stress engineering, as shown in a view 700 of FIG. 7, is to place external isolation structures 706 around a plurality of cavities 704A-C formed in a cavity layer 702. The amount of stress is adjusted differently for pixel structures in cavities 704A, 704C closest to the external isolation structures 706 than pixel structures in cavities 704B farthest from the external isolation structures 706. Cavities 708 outside of the external isolation structures will have diminished effects of the stress control provided by the external isolation structures as the distance away from the external isolation structures increases.

Figure 8:
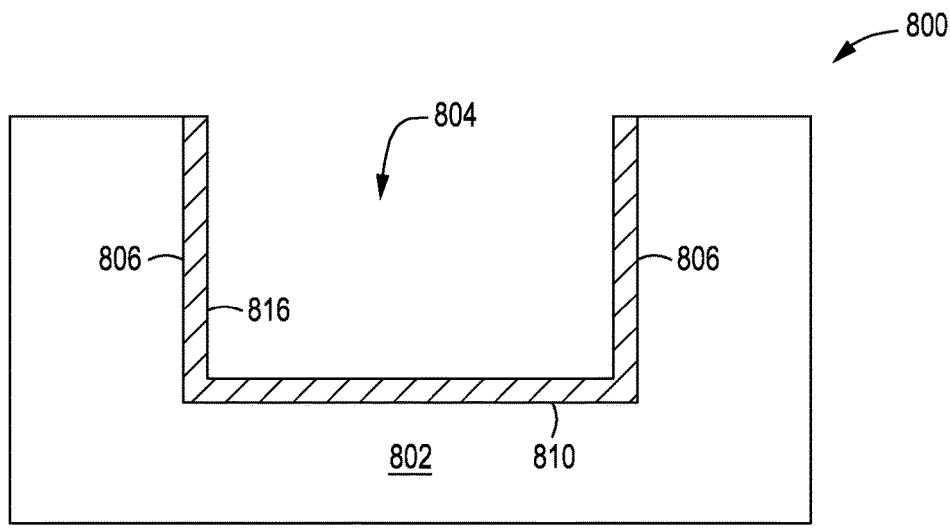
FIG. 8 depicts a cross-sectional view of a cavity with a passivation layer formed inside the cavity in accordance with some embodiments of the present principles.

A passivation layer 816 may be formed in a cavity 804 in a cavity layer 802 as depicted in a view 800 of FIG. 8. In some embodiments, the passivation layer 816 is a conformal layer that is formed on the walls 806 and the bottom 810 of the cavity. The passivation layer 816 may have a thickness of approximately 10 angstrom to approximately 200 angstrom. The passivation layer 816 may be comprised of dopants or high k materials. After forming a cavity, surfaces of the cavity generally exhibit crystal damage caused by the processes used to form the cavity. For emitter pixel structures, the crystal damage or defects can be leakage paths for electrons/holes. The passivation layer serves to passivate or recombine leakage paths and improve the quantum efficiency of the emitter pixel structures. For sensor pixel structures, the crystal damage or defects can generate electrical signals (dark noise) even if no light is impinging on the image sensor. The passivation layer serves to passivate or recombine and cancel the errant electrical signals (dark noise), increasing the image sensor's signal to noise ratio performance.

Figure 9:
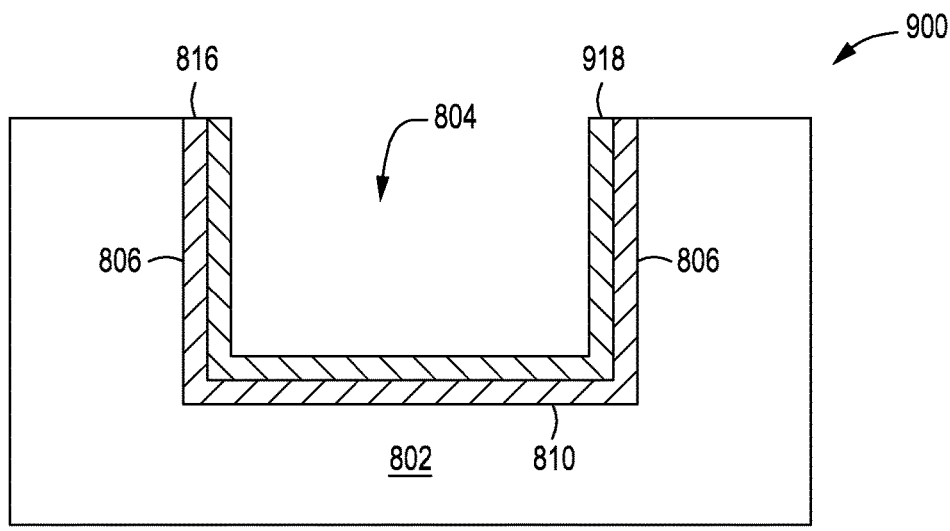
FIG. 9 depicts a cross-sectional view of a cavity with a DBR layer formed on a passivation layer in accordance with some embodiments of the present principles.

At least one optical layer may be formed in the cavity 804 of the cavity layer 802 as depicted in a view 900 of FIG. 9. In some embodiments (as shown in FIG. 9), the at least one optical layer 918 is formed on the passivation layer 816. The at least one optical layer 918 may have a thickness of approximately 50 nm to approximately 200 nm. The at least one optical layer 918 may function as a reflective optical layer to increase a lumen output of an emitter pixel structure or as an optical isolation layer for a sensor pixel structure formed within the cavity 804. In some embodiments, the at least one optical layer 918 may be augmented through implantation or doping to also provide a charge passivation and/or a further isolation function. In some embodiments, the at least one optical layer 918 may be comprised of dielectric and/or metal material. In some embodiments, the at least one optical layer 918 may form a distributed Bragg reflector (DBR) layer. The DBR layer influences optical wavelengths by alternating layers of different materials with varying refractive indexes. Optical waves are reflected at each of the layer boundaries. Different layer configurations can be used to provide complete optical reflection as a mirror or only at certain wavelengths as a filter. In some embodiments, the at least one optical layer 918 may form a DBR filter layer to function as an optical filter to alter the wavelength (and color) output of the LED. The DBR filter layer can be used to reflect certain wavelengths of light while permitting other wavelengths of light to pass as a wavelength filter for stacked sensor pixel structures (RGB). The DBR layers may be deposited using an ALD or CVD deposition process or epitaxially grown. In some embodiments, a DBR filter layer may be optionally formed on the emitter pixel structure after the emitter pixel is formed to filter the light output of the LED.

Figure 10:
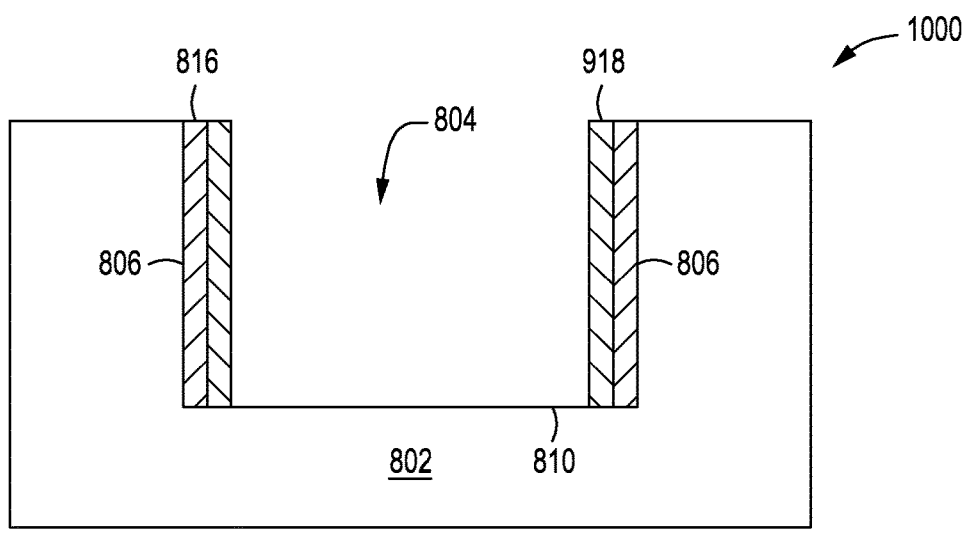
FIG. 10 depicts a cross-sectional view of a cavity with an exposed bottom surface in accordance with some embodiments of the present principles.
Figure 11:
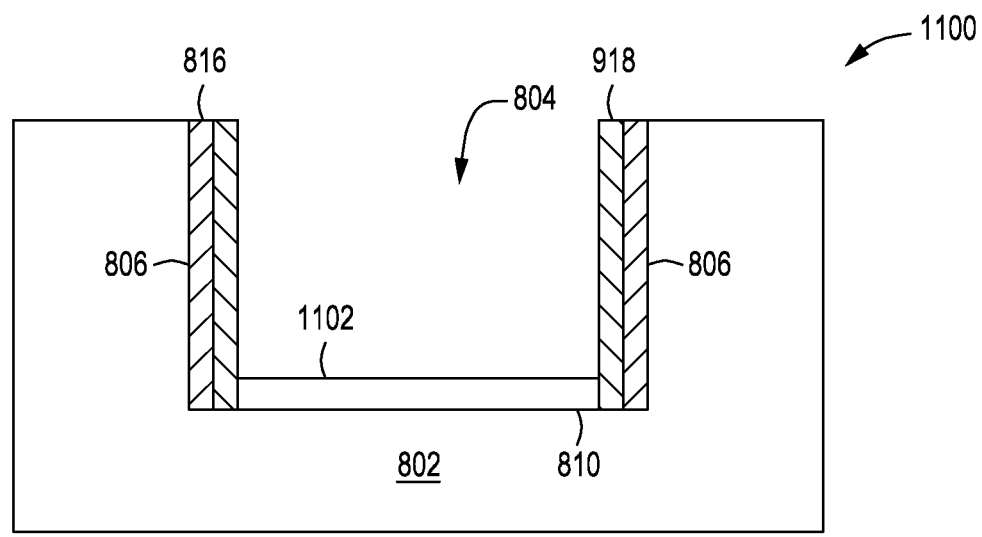
FIG. 11 depicts a cross-sectional view of a cavity with a charge passivation layer in accordance with some embodiments of the present principles.
Figure 12:
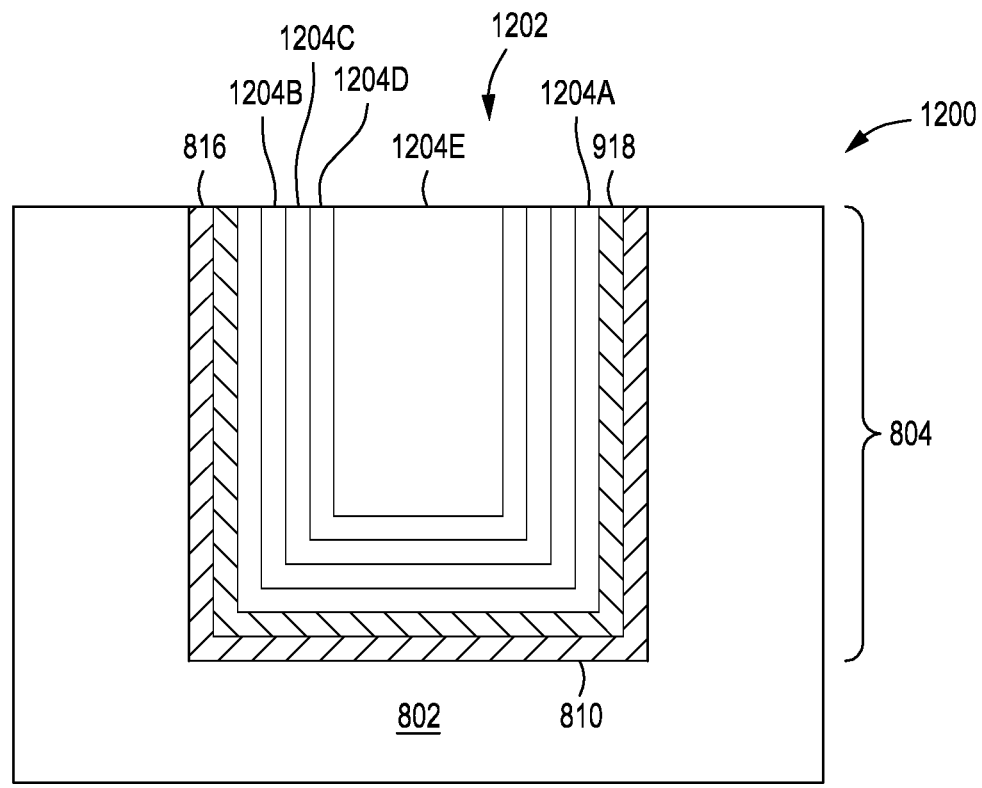
FIG. 12 depicts a cross-sectional view of an emitter pixel structure formed by epitaxial growth or conformal deposition methods in accordance with some embodiments of the present principles.

The bottom 810 of the cavity 804 is optionally etched to remove any depositions from the bottom of the cavity 804 as depicted in a view 1000 of FIG. 10 and a charge passivation layer 1102 is optionally formed on the bottom 810 of the cavity 804 as depicted in a view 1100 of FIG. 11. The bottom 810 of the cavity 804 may be etched to expose the substrate material if a subsequent pixel structure formation process will use epitaxial growth or selective deposition methods with crystallization processes. The etching during formation of the cavity 804 can cause damage to the crystal structure of the substrate material and a charge passivation layer 1102 may be used to rectify the damage from the etching process. The charge passivation layer 1102 serves a dual function in that the charge passivation layer 1102 passivates or minimizes the crystal defects while also carrying a charge that influences the work function of the emitter pixel structure to increase the LED's quantum efficiency and/or alter the wavelength of the LED or influences the work function of the sensor pixel structure to increase an image sensor's quantum efficiency.

Figure 16:
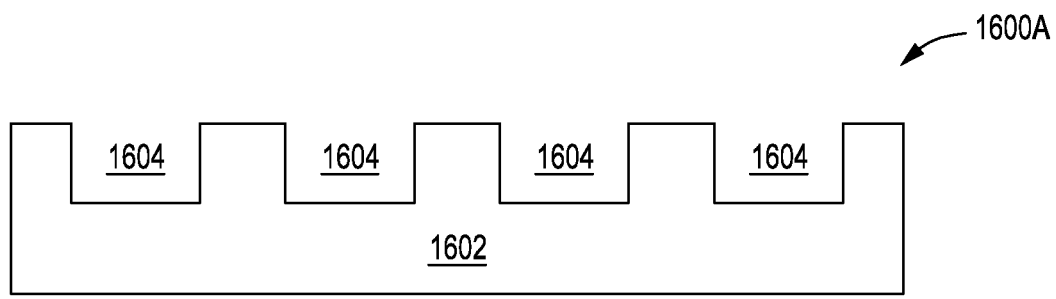
FIG. 16 depicts a cross-sectional view of integrating emitter pixel structures and sensor pixel structures on a common substrate in accordance with some embodiments of the present principles.
Figure 16:
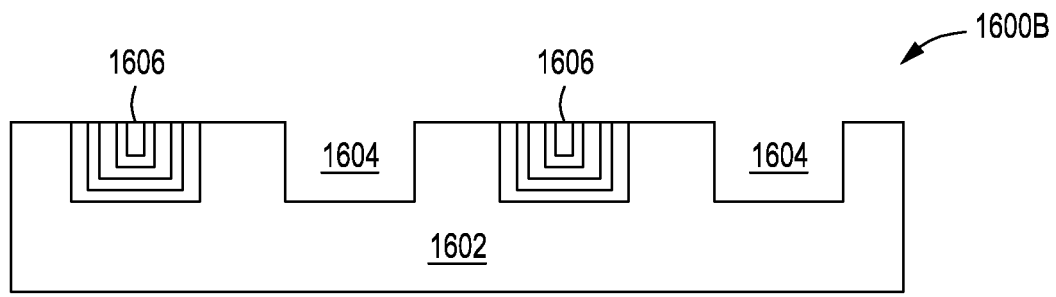
Figure 16:
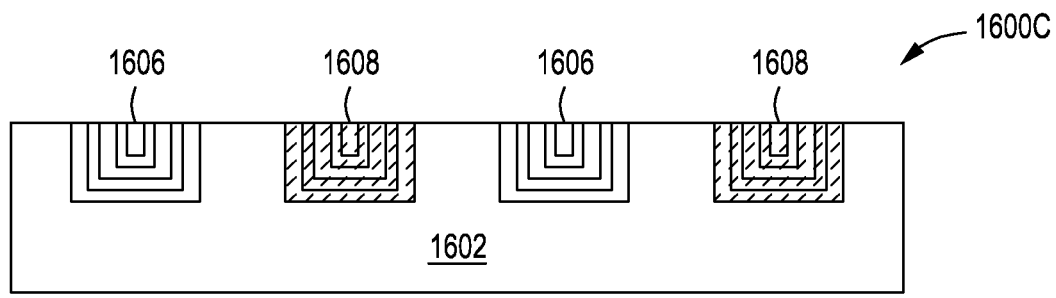
Figure 16:
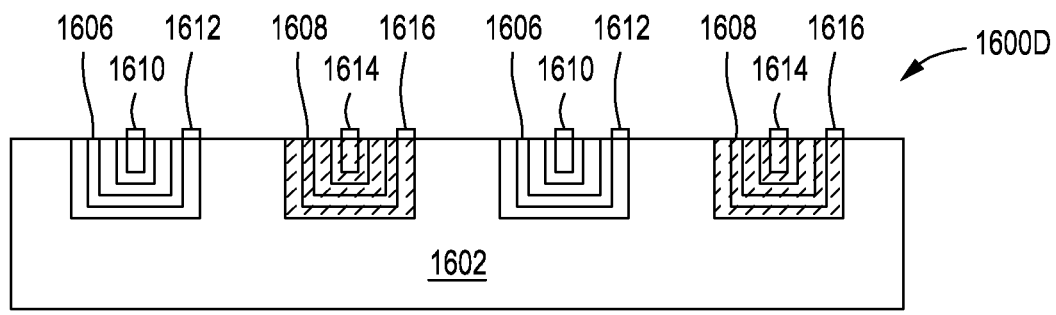
Figure 16:
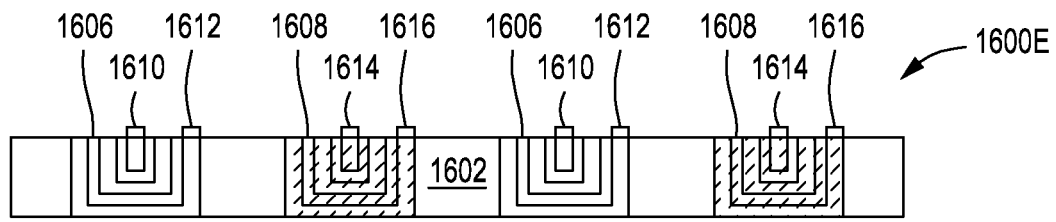

In block 104 of FIG. 1, at least one emitter pixel structure is formed in at least one of the plurality of cavities 1604 as depicted in a view 1600B of FIG. 16 (the view 1600B shows conformally formed pixel structures for the sake of brevity—the pixel structures may also be nonconformally formed pixel structures). The emitter pixel structure 1606 may be adjacent to another emitter pixel structure (not shown) or separated by one or more sensor pixel structures as depicted in the view 1600C. In some embodiments as depicted in a view 1200 of FIG. 12, the emitter pixel structure 1202 is formed by, for example, ALD deposition or CVD deposition or epitaxial growth processes in a conformal manner. The "layers" 1204A-E are meant to represent the compositional control over the internal structure of the emitter pixel structure 1202 that is obtained by performing the method of the present principles. For example, the boundaries of the "layers" 1204A-E may be dopant gradient transitions and the like. The number of "layers" may be more or less, and five layers is not meant to be limiting in any manner or to imply that the internal structure of the emitter pixel structure has distinct layers. As the emitter pixel structure 1202 is deposited by deposition, various dopant gases at various rates and densities may be used to dope the deposited material with high control during a single deposition process, dramatically increasing throughput while increasing performance of the LED. In some embodiments, layer 1204A may be an N-type layer and layer 1204E may be a P-type layer. In some embodiments, layer 1204A may be P-type layer and layer 1204E may be an N-type layer. One significant advantage of the conformal formation of the emitter pixel structure 1202 is that both contacts (N-type and P-type contacts) of the emitter pixel structure may be easily accessed from one side of the emitter pixel structure and at the same height, making integration of the emitter pixel structures CMOS fabrication compatible and extremely cost effective with little or no requirement for via formations during processing. Another benefit is to leverage the length difference between an outer layer 1204B and an inner layer 1204E in which higher mobility or longer lifetime carriers can be injected into the outer layer 1204B while lower mobility or shorter lifetime carriers can be injected into the inner layer 1204E (forming the emitter pixel structure with different carrier injection or diffusion lengths and junction surface areas between electrons and holes or n-type and p-type). The approach can be combined together with stress/strain and/or work-function/electric-field engineering to enable better carrier recombination and higher quantum efficiency.

Figure 13:
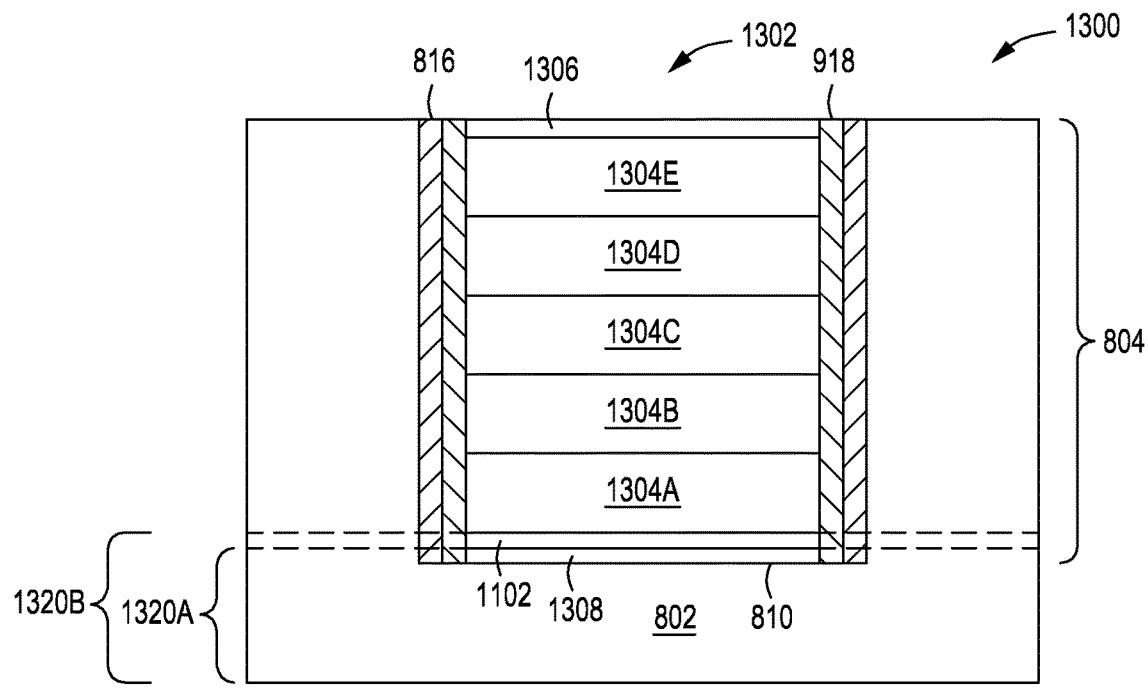
FIG. 13 depicts a cross-sectional view of an emitter pixel structure formed by epitaxial growth or selective deposition methods in accordance with some embodiments of the present principles.
Figure 14:
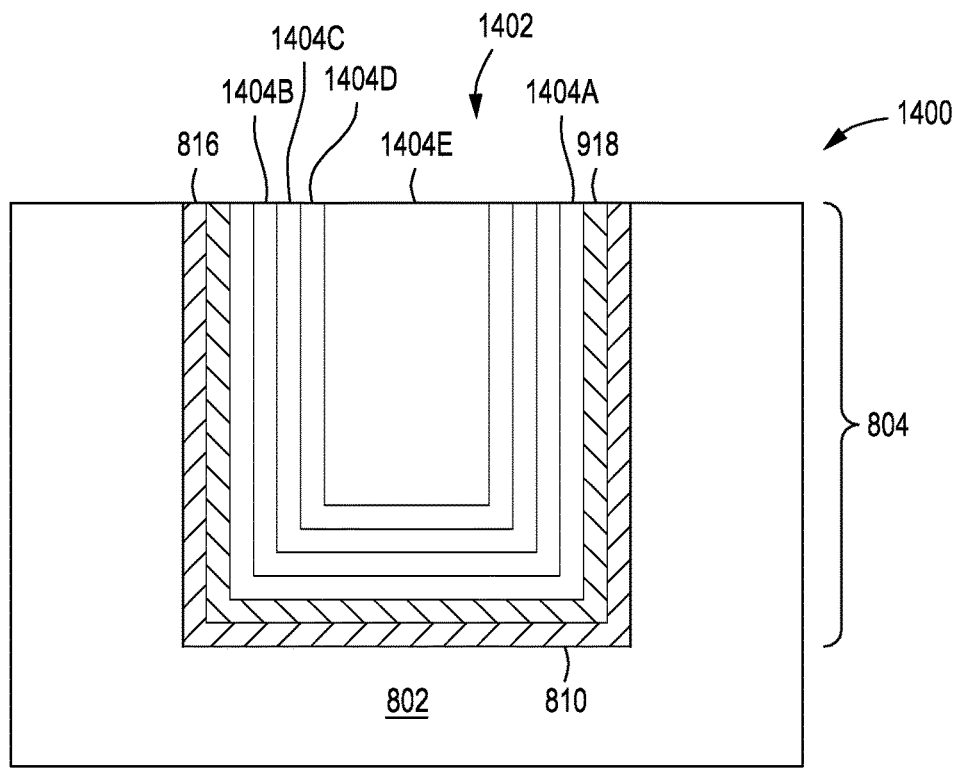
FIG. 14 depicts a cross-sectional view of a sensor pixel structure formed by epitaxial growth or conformal deposition methods in accordance with some embodiments of the present principles.

In some embodiments as depicted in a view 1300 of FIG. 13, the emitter pixel structure 1302 is formed in a nonconformal manner by, for example, epitaxial growth using a molecular beam epitaxy (MBE) process or other deposition techniques or selective deposition processes and the like. The "layers" 1304A-E are meant to represent the compositional control over the internal structure of the emitter pixel structure 1302 that is obtained by performing the method of the present principles. For example, the boundaries of the "layers" 1304A-E may be dopant gradient transitions and the like. The number of "layers" may be more or less, and five layers is not meant to be limiting in any manner or to imply that the internal structure of the emitter pixel structure has distinct layers. As the emitter pixel structure 1302 is formed by epitaxial growth or selective deposition processes, various dopant gases at various rates and densities may be used to dope the deposited material with high control during a single epitaxial growth or selective deposition process, dramatically increasing throughput while increasing performance of the LED. In some embodiments, further stress engineering techniques may be performed during the formation of the emitter pixel structure. Materials or dopants may be selected to increase/decrease stress within the pixel structure. In some embodiments, passivation, DBR mirror/filter, isolation, and work function may be achieved as a single process during the formation of the emitter pixel structure, increasing throughput and performance while reducing costs. In some embodiments, layer 1304A may be an N-type layer and layer 1304E may be a P-type layer. In some embodiments, layer 1304A may be P-type layer and layer 1304E may be an N-type layer. In some embodiments, as mentioned above, a DBR filter layer 1306 may be formed on the layer 1304E of emitter pixel structure 1302 to filter transmitted light from the LED. The DBR structure can also be designed as a reflector (optional DBR mirror layer 1308) and integrated with the charge passivation layer 1102 for more light output through the top of the emitter pixel structure 1302. If the cavity layer 802 is polished (e.g., chemical mechanical polishing (CMP)) to remove a first portion 1320A or a second portion 1320B of the bottom of the cavity layer 802 to expose the layer 1304A or charge passivation layer 1102 (without formation of optional DBR mirror layer 1308), the DBR filter layer 1306, formed as a mirror layer, will enhance light output through the layer 1304A or the charge passivation layer 1102 and out of the bottom of the emitter pixel structure 1302.

In block 106 of FIG. 1, at least one sensor pixel structure is formed in at least one of the plurality of cavities as depicted in a view 1600C of FIG. 16 (the view 1600C shows conformally formed pixel structures for the sake of brevity—the pixel structures may also be nonconformally formed pixel structures). The sensor pixel structure 1608 may be adjacent to another sensor pixel structure (not shown) or separated by one or more emitter pixel structures as depicted in the view 1600C. In some embodiments as depicted in a view 1400 of FIG. 14, the sensor pixel structure 1402 is formed by, for example, ALD deposition, CVD deposition, or epitaxial growth processes in a conformal manner. The "layers" 1404A-E are meant to represent the compositional control over the internal structure of the sensor pixel structure 1402 that is obtained by performing the method of the present principles. For example, the boundaries of the "layers" 1404A-E may be dopant gradient transitions and the like. The number of "layers" may be more or less, and five layers is not meant to be limiting in any manner or to imply that the internal structure of the sensor pixel structure has distinct layers. As the sensor pixel structure 1402 is deposited by deposition, various dopant gases at various rates and densities may be used to dope the deposited material with high control during a single deposition process, dramatically increasing throughput while increasing performance of the image sensor.

Figure 15:
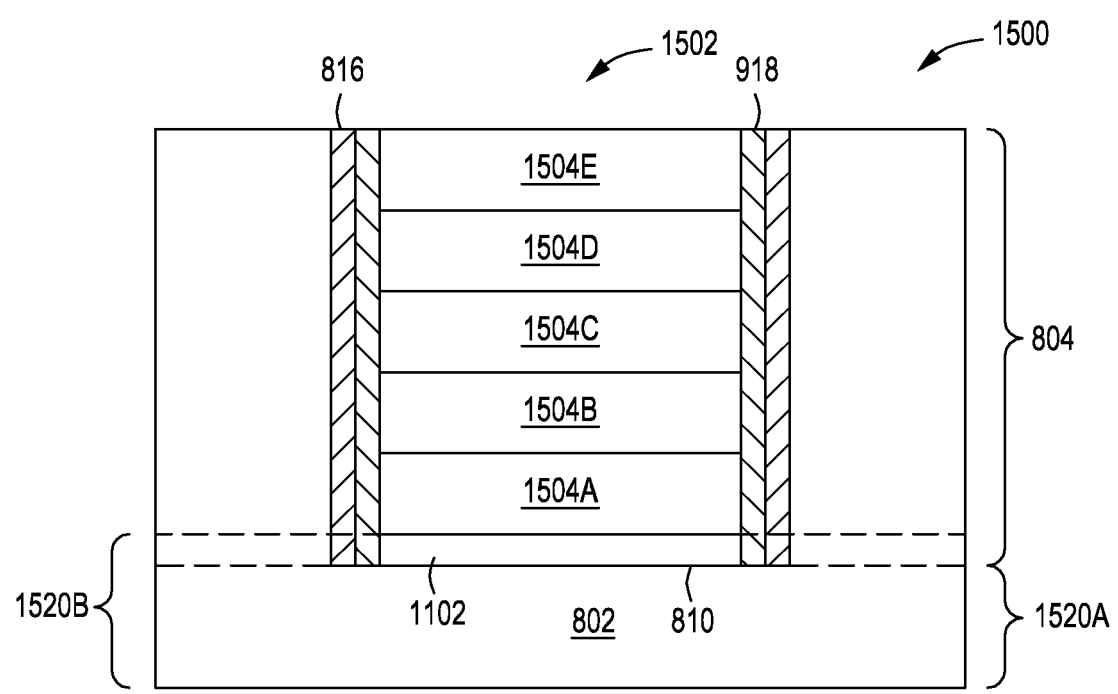
FIG. 15 depicts a cross-sectional view of a sensor pixel structure formed by epitaxial growth or selective deposition methods in accordance with some embodiments of the present principles.

In some embodiments as depicted in a view 1500 of FIG. 15, the sensor pixel structure 1502 is formed in a nonconformal manner by, for example, epitaxial growth using a molecular beam epitaxy (MBE) process or other deposition techniques or selective deposition processes and the like. The "layers" 1504A-E are meant to represent the compositional control over the internal structure of the sensor pixel structure 1502 that is obtained by performing the method of the present principles. For example, the boundaries of the "layers" 1504A-E may be dopant gradient transitions and the like. The number of "layers" may be more or less, and five layers is not meant to be limiting in any manner or to imply that the internal structure of the sensor pixel structure has distinct layers. As the sensor pixel structure 1502 is formed by epitaxial growth or selective deposition processes, various dopant gases at various rates and densities may be used to dope the deposited material with high control during a single epitaxial growth or selective deposition process, dramatically increasing throughput while increasing performance of the image sensor. In some embodiments, a plurality of sensor pixel structures (stacked sensor pixel structure) may be formed in a single cavity. In some embodiments, further stress engineering techniques may be performed during the formation of the sensor pixel structure. During formation of the sensor pixel structure, materials or dopants may be selected to increase/decrease stress within the pixel structure. In some embodiments, passivation, DBR mirror/filter, isolation, and work function may be achieved as a single process during the formation of the sensor pixel structure, increasing throughput and performance while reducing costs. If a backside illumination (BSI) scheme is adopted, the cavity layer 802 is polished (e.g., chemical mechanical polishing (CMP)) to remove a first portion 1520A or a second portion 1520B of the bottom of the cavity layer 802 to expose the layer 1504A with the charge passivation layer 1102 as an etching stop or to expose the charge passivation layer 1102 then followed by the rest of the optical layer fabrications.

A crystallization process is optionally performed on the pixel structures (emitter pixel structure or sensor pixel structure). When a pixel structure is deposited in a cavity as opposed to epitaxially grown, the pixel structure could be in a non-crystalline form that will inhibit the pixel structure's performance. By performing the crystallization process on a deposited pixel structure, the dislocation or defect density of the crystals of the pixel structure can be reduced, yielding a higher performing pixel structure. The crystallization process may include subjecting the pixel structure to high heat and pressure. For example, the temperature may range from approximately 400 degrees Celsius to approximately 1200 degrees Celsius, the pressure may range from approximately 1 Torr to approximately 760 Torr, and the duration may range from a few nanoseconds to approximately 1 hour. The crystallization process is optional because pixel structures grown by epitaxial growth do not need crystallization to increase performance of the pixel structure.

At least one external isolation structure may be optionally formed near the cavity 604 formed in a cavity layer 602 after the formation of an emitter pixel structure or a sensor pixel structure. The external isolation structure may be optional if the external isolation structure has been previously formed prior to the pixel structure formation as described above. In some embodiments, the external isolation structure may be formed both prior to and after the formation of the pixel structure and may use different types of external isolation structures (e.g., combination of shallow and deep trenches with same or different materials/treatment, etc.). As noted above, the term "external" is used for isolation structures that do not reside within the walls of the cavity. The external isolation structures 606 are used to adjust the amount of stress acting on the emitter pixel structure that is formed within the cavity 604. The external isolation structures 606 may be, for example but not limited to, shallow trench isolation (STI) structures and/or deep trench isolation (DTI) structures and the like. If the cavity 604 is formed in a mold layer, the mold layer material may be considered an external isolation structure and may be adjusted (e.g., material selection such as dielectric or metal materials, dopants, annealing processes, etc.) to produce varying stress levels and force directions on the emitter pixel structure subsequently formed in the cavity 604 (see stress engineering examples below). In some embodiments, the mold layer may be partially or completely removed to produce varying stress levels on the pixel structure.

After the formation of the pixel structure (emitter or sensor), stress engineering may be optionally performed. As discussed above, the stress engineering may be performed prior to and/or after the formation of the pixel structure in a cavity. The stress engineering of the pixel structure may also make use of material selections used to gapfill the trenches or other isolation structures to further influence the amount of stress acting on the pixel structure. The amount of stress can also be even further influenced or adjusted by curing the material in the external isolation structures, implanting dopants into the material in the external isolation structures, and/or annealing of the material in the external isolation structures, etc. The multitude of ways available (including leveraging the cavity engineering as described above) for adjusting the amount of stress acting on the pixel structure allows for fine levels of stress control that is not otherwise achievable, yielding substantially higher performances out of the pixel structures. Another technique available for stress engineering, as shown in FIG. 7, is to place external isolation structures 706 around a plurality of cavities 704A-C formed in a cavity layer 702. The amount of stress is adjusted differently for pixel structures in cavities 704A, 704C closest to the external isolation structures 706 than pixel structures in cavities 704B farthest from the external isolation structures 706. Cavities 708 outside of the external isolation structures will have diminished effects of the stress control provided by the external isolation structures as the distance away from the external isolation structures increases.

In block 108 of FIG. 1, contacts are formed on at least one emitter pixel structure on a first emitter contact area 1610 and on a second emitter contact area 1612 where both the first emitter contact area 1610 and the second emitter contact area 1612 are on the same side of a substrate and at the same height as depicted in a view 1600D of FIG. 16. In block 110, contacts are formed on at least one sensor pixel structure on a first sensor contact area 1614 and on a second sensor contact area 1616 where both the first sensor contact area 1614 and the second sensor contact area 1616 are on the same side of a substrate and at the same height as depicted in a view 1600D of FIG. 16. In some embodiments, the cavity layer 1602 may undergo subsequent processing to polish or remove (CMP processing) a backside portion of the cavity layer 1602 as depicted in a view 1600E of FIG. 16. The removal of a backside portion of the cavity layer 1602 may be performed to allow for backside emission and/or absorption of light and the like by an emitter pixel structure and/or a sensor pixel structure.

Figure 17:
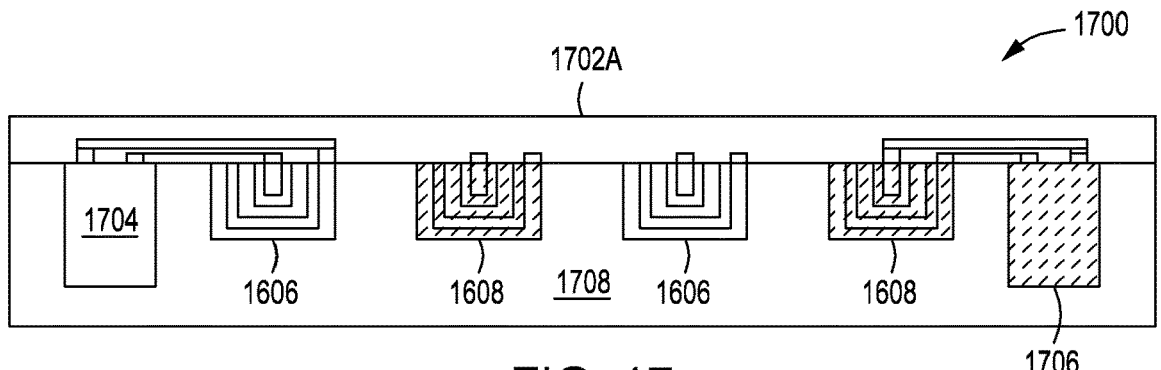
FIG. 17 depicts a cross-sectional view of integrating pixel structures and additional circuitry in a common layer in accordance with some embodiments of the present principles.
Figure 18:
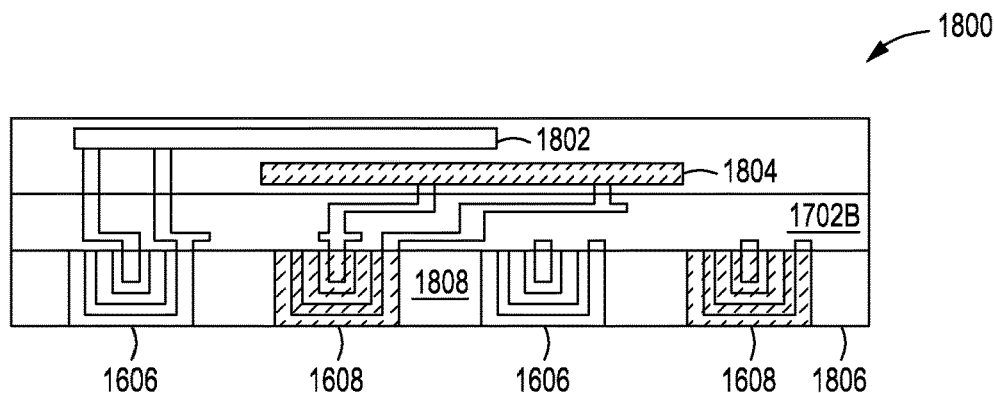
FIG. 18 depicts a cross-sectional view of integrating pixel structures and additional circuitry through addition of subsequent layers in accordance with some embodiments of the present principles.
Figure 19:
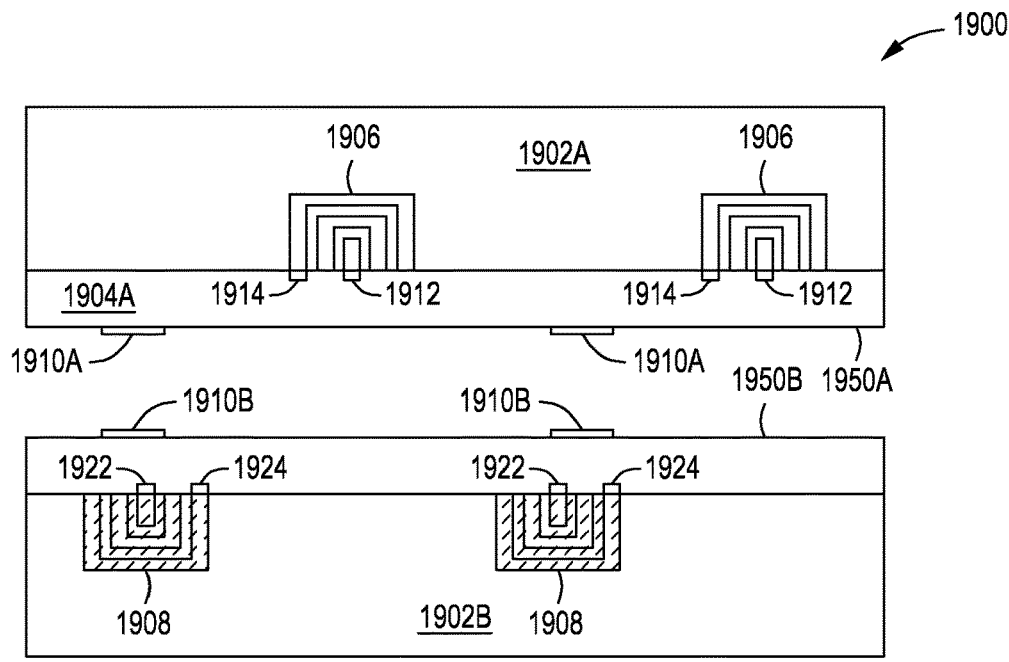
FIG. 19 depicts a cross-sectional view of integrating pixel structures using multiple substrates in accordance with some embodiments of the present principles.
Figure 20:
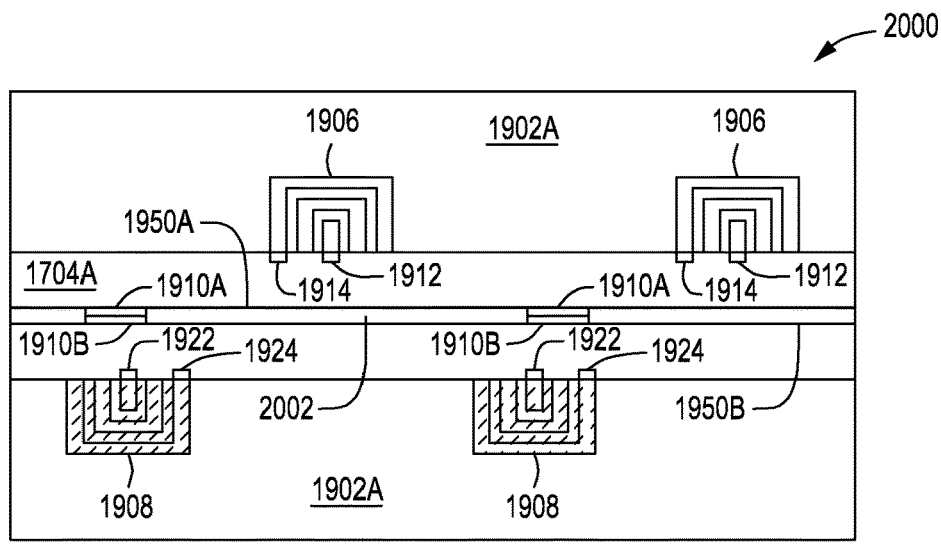
FIG. 20 depicts a cross-sectional view of bonding multiple substrates in accordance with some embodiments of the present principles.
Figure 21:
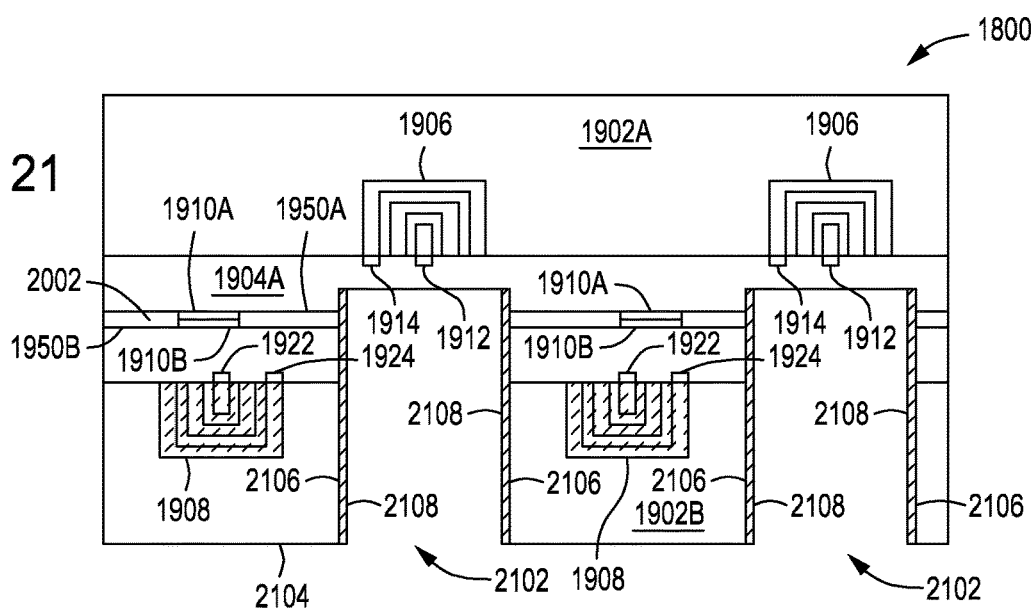
FIG. 21 depicts a cross-sectional view of exposing emitter pixel structures in accordance with some embodiments of the present principles.
Figure 22:
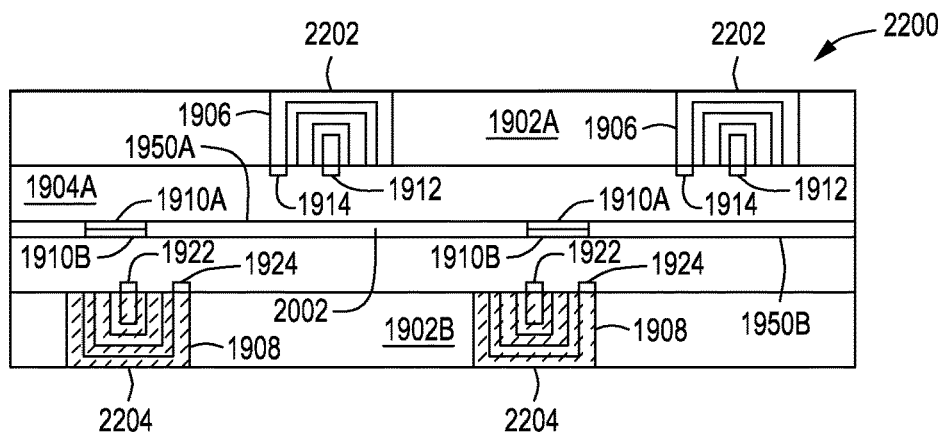
FIG. 22 depicts a cross-sectional view of backside polishing of both substrates in accordance with some embodiments of the present principles.

In block 112, a driver circuit 1704 or readout circuit 1706 may be optionally formed on the substrate 1708 adjacent to the emitter pixel structures 1606 or sensor pixel structures 1608, respectively, as depicted in a view 1700 of FIG. 17. Having the driver circuit 1704 and/or the readout circuit 1706 adjacent to the pixel structures allows for minimal interconnect structure and maximum frontside illumination or absorption. In block 114, a redistribution layer may be optionally formed on a top surface of a substrate. An interconnect redistribution layer 1702A as depicted in a view 1700 of FIG. 17 interconnects the emitter pixel structures 1606 to the driver circuit 1704 and interconnects the sensor pixel structures 1608 to the readout circuit 1706 formed in the substrate. Because the contacts of the emitter pixel structures 1606 and the sensor pixel structures 1608 are on the same side and the same height, a minimal redistribution layer is needed, allowing for maximum frontside illumination and absorption by the pixel structures. Proper selection of materials (highly translucent materials for given wavelengths, etc.) and thicknesses for the interconnect redistribution layer 1702A will further enhance light emissions and absorptions. In some embodiments, backside illumination and absorption may be selected. In some embodiments, a redistribution layer 1702B as depicted in a view 1800 of FIG. 18 may be formed on the emitter pixel structures 1606 and the sensor pixel structures 1608 to allow connections to a subsequently formed layers containing additional circuitry. In block 116, a driver circuit 1802 or a readout circuit 1804 may be optionally formed on the substrate 1808 as depicted in the view 1800 of FIG. 18. The driver circuit 1802 and the readout circuit 1804 are subsequently formed on the redistribution layer 1702B as part of a back end of line (BEOL) process. In block 118, a bottom surface 1806 of the substrate 1808 is optionally planarized to expose at least one emitter pixel structure and/or at least one sensor pixel structure as depicted in the view 1800 of FIG. 18. As one skilled in the art can appreciate, the emitter pixel structures and the sensor pixel structures may also be configured to have emitting or sensing surfaces facing opposite sides of a substrate or substrates using the techniques of the present principles.

Figure 2:
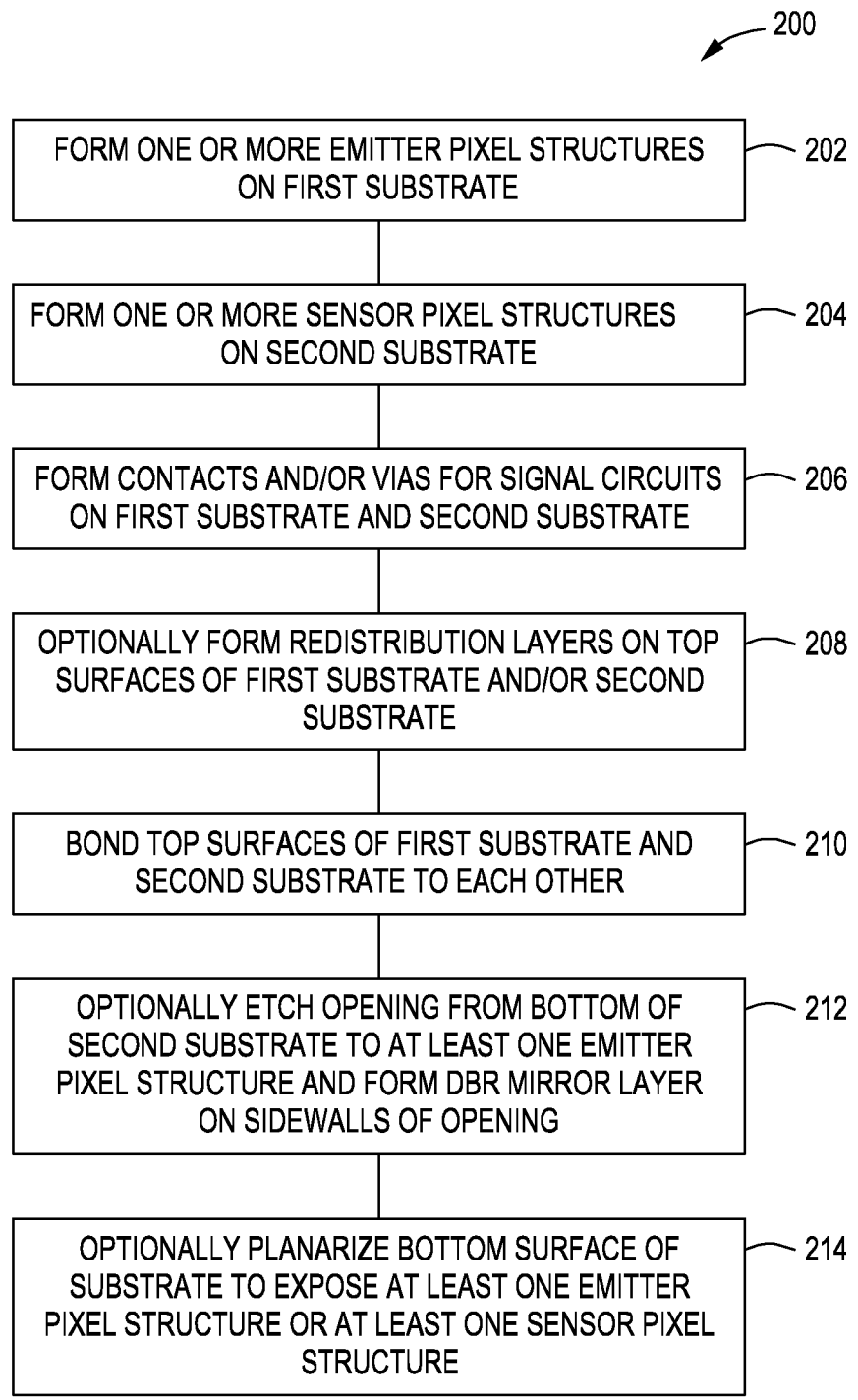
FIG. 2 is a method of LED and image sensor integration with substrate bonding in accordance with some embodiments of the present principles.

An example method 200 is depicted in FIG. 2 with reference to FIGS. 19-22. In block 202, one or more emitter pixel structures 1906 are formed on a first substrate 1902A as depicted in a view 1900 of FIG. 19 (first substrate 1902A is inverted). In block 204, one or more sensor pixel structures 1908 are formed on a second substrate 1902B. In block 206, contacts and/or vias are formed to signal circuits (readout or driver, etc.) on the first substrate 1902A and/or the second substrate 1902B. In block 208, redistribution layers are optionally formed on the top surfaces of the first substrate 1902A and/or the second substrate 1902B. In the example, a redistribution layer 1904A has been formed to distribute the first contact areas 1912 and the second contact areas 1914 of the one or more emitter pixel structures 1906 to top contacts 1910A. In the example, a redistribution layer 1904B has been formed to distribute the first contact areas 1922 and the second contact areas 1924 of the one or more sensor pixel structures 1908 to top contacts 1910B. In block 210, the top surface 1950A of the first substrate 1904A and top surface 1950B of the second substrate 1904B are bonded together as depicted in a view 2000 of FIG. 20. The bonding process may include an adhesive 2002 and may further include heating one or more surfaces to promote better adhesion between the surfaces. In block 212, openings 2102 may be optionally etched from a bottom 2104 of the second substrate 1902B to at least one emitter pixel structure and a DBR mirror layer 2108 may be formed on sidewalls 2106 of the openings 2102 as depicted in a view 2100 of FIG. 21. One skilled in the art can appreciate that openings may also be etched to expose one or more sensor pixel structures on the opposite side of the emitter pixel openings and the like. In block 214, a bottom surface of one or more substrates may be optionally planarized to expose at least one emitter pixel structure or at least one sensor pixel structure. As depicted in a view 2200 of FIG. 22, substrate thinning can also be applied on both the first substrate 1902A and the second substrate 1902B in which the emitter surfaces 2202 and the sensor surfaces 2204, respectively, are both exposed but facing opposite sides.

Embodiments in accordance with the present principles may be implemented in hardware, firmware, software, or any combination thereof. Embodiments may also be implemented as instructions stored using one or more computer readable media, which may be read and executed by one or more processors. A computer readable medium may include any mechanism for storing or transmitting information in a form readable by a machine (e.g., a computing platform or a "virtual machine" running on one or more computing platforms). For example, a computer readable medium may include any suitable form of volatile or non-volatile memory. In some embodiments, the computer readable media may include a non-transitory computer readable medium.

While the foregoing is directed to embodiments of the present principles, other and further embodiments of the principles may be devised without departing from the basic scope thereof.

The invention claimed is:

1. A method for integrating an image sensor and a light emitting diode (LED), comprising:
   forming a plurality of cavities on a substrate, the plurality of cavities having at least one cavity profile and configured to accept an emitter pixel structure of the LED or a sensor pixel structure of the image sensor;
   depositing or epitaxially growing, in situ, layer by layer, a first plurality of layers of at least one emitter pixel structure completely filling at least a first one of the plurality of cavities on the substrate, wherein the at least one emitter pixel structure is configured to have a plurality of exposed direct emitter contact areas on a same side and at a same height and wherein the exposed direct emitter contact areas are exposed areas of two or more different layers of the first plurality of layers; and depositing or epitaxially growing, in situ, layer by layer, a second plurality of layers of at least one sensor pixel structure completely filling at least a second one of the plurality of cavities on the substrate adjacent to the at least one emitter pixel structure, wherein the at least one sensor pixel structure is configured to have a plurality of exposed direct sensor contact areas on a same side and at a same height and wherein the exposed direct sensor contact areas are exposed areas of two or more different layers of the second plurality of layers.

2. The method of claim 1, further comprising:
forming contacts on the at least one emitter pixel structure on the plurality of exposed direct emitter contact areas; and
forming contacts on the at least one sensor pixel structure on the plurality of exposed sensor contact areas.

3. The method of claim 2, further comprising:
forming a redistribution layer on the substrate; and
interconnecting at least one driver circuit to the at least one emitter pixel structure via the redistribution layer to control at least one of the at least one emitter pixel structure of the LED.

4. The method of claim 2, further comprising:
forming a redistribution layer on the substrate; and
interconnecting at least one readout circuit to the at least one sensor pixel structure via the redistribution layer to control at least one of the at least one sensor pixel structure of the image sensor.

5. The method of claim 1, further comprising:
planarizing a bottom surface of the substrate to expose a first bottom area of the at least one emitter pixel structure to allow for backside emission from the at least one emitter pixel structure or planarizing the bottom surface of the substrate to expose a second bottom area of the at least one sensor pixel structure to allow for backside absorption of light by the at least one sensor pixel structure.

6. The method of claim 1, further comprising:
forming a mold layer on the substrate; and
forming the plurality of cavities on the substrate by etching plurality of cavities in the mold layer.

7. The method of claim 1, further comprising:
forming the plurality of cavities on the substrate by etching plurality of cavities into a substrate material.

8. The method of claim 1, further comprising:
forming the at least one emitter pixel structure using an atomic layer deposition (ALD) process, a chemical vapor deposition (CVD) process, or a molecular beam epitaxy (MBE) process; and
crystallizing the at least one emitter pixel structure by heating the at least one emitter pixel to a temperature of approximately 400 degrees Celsius to approximately 1200 degrees Celsius and at a pressure of approximately 1 Torr to approximately 760 Torr for a duration of greater than 1 nanosecond to approximately 1 hour.

9. The method of claim 1, further comprising:
forming the at least one sensor pixel structure using an atomic layer deposition (ALD) process, a chemical vapor deposition (CVD) process, or a molecular beam epitaxy (MBE) process; and crystallizing the at least one sensor pixel structure by heating the at least one sensor pixel to a temperature of approximately 400 degrees Celsius to approximately 1200 degrees Celsius and at a pressure of approximately 1 Torr to approximately 760 Torr for a duration of greater than 1 nanosecond to approximately 1 hour.

10. A method for integrating an image sensor and a light emitting diode (LED), comprising:
forming a hardmask pattern on a substrate;
forming a plurality of cavities on the substrate based on the hardmask pattern, the plurality of cavities having at least one cavity profile and configured to accept an emitter pixel structure of the LED or a sensor pixel structure of the image sensor;
depositing, in situ, layer by layer, a first plurality of layers of at least one conformal emitter pixel structure using conformal layers covering sides and a bottom in at least a first one of the plurality of cavities on the substrate and completely filling the first one of the plurality of cavities, wherein the at least one conformal emitter pixel structure is configured to have a plurality of exposed direct emitter contact areas on a same side and at a same height and wherein the exposed direct emitter contact areas are exposed areas of two or more different layers of the conformal layers;
depositing, in situ, a second plurality of layers of at least one conformal sensor pixel structure using conformal layers covering sides and a bottom in at least a second one of the plurality of cavities on the substrate and completely filling the second one of the plurality of cavities, wherein the at least one conformal sensor pixel structure is configured to have a plurality of exposed direct sensor contact areas on a same side and at a same height and wherein the exposed direct sensor contact areas are exposed areas of two or more different layers of the conformal layers;
forming contacts on the at least one conformal emitter pixel structure on the plurality of exposed direct emitter contact areas; and
forming contacts on the at least one conformal sensor pixel structure on the plurality of exposed direct sensor contact areas.

11. The method of claim 10, further comprising:
forming a mold layer on the substrate; and
forming the plurality of cavities on the substrate by etching plurality of cavities in the mold layer.

12. The method of claim 10, further comprising:
forming the plurality of cavities on the substrate by etching plurality of cavities into a substrate material.

13. The method of claim 10, further comprising:
forming the at least one conformal emitter pixel structure using an atomic layer deposition (ALD) process, a chemical vapor deposition (CVD) process, or a molecular beam epitaxy (MBE) process; and
crystallizing the at least one conformal emitter pixel structure by heating the at least one conformal emitter pixel to a temperature of approximately 400 degrees Celsius to approximately 1200 degrees Celsius and at a pressure of approximately 1 Torr to approximately 760 Torr for a duration of greater than 1 nanosecond to approximately 1 hour.

14. The method of claim 10, further comprising:
forming the at least one conformal sensor pixel structure using an atomic layer deposition (ALD) process, a chemical vapor deposition (CVD) process, or a molecular beam epitaxy (MBE) process; and crystallizing the at least one conformal sensor pixel structure by heating the at least one conformal sensor pixel to a temperature of approximately 400 degrees Celsius to approximately 1200 degrees Celsius and at a pressure of approximately 1 Torr to approximately 760 Torr for a duration of greater than 1 nanosecond to approximately 1 hour.

15. The method of claim 10, further comprising:
forming a redistribution layer on the substrate;
interconnecting at least one driver circuit to the at least one conformal emitter pixel structure via the redistribution layer to control at least one of the at least one conformal emitter pixel structure of the LED; and
interconnecting at least one readout circuit to the at least one conformal sensor pixel structure via the redistribution layer to control at least one of the at least one conformal sensor pixel structure of the image sensor.

16. The method of claim 15, wherein the at least one driver circuit or the at least one readout circuit is formed in a substrate material adjacent to the at least one conformal emitter pixel structure or adjacent to the at least one conformal sensor pixel structure.

17. A non-transitory, computer readable medium having instructions stored thereon that, when executed, cause a method for integrating an image sensor and a light emitting diode (LED) to be performed, the method comprising:
forming a plurality of cavities on a substrate, the plurality of cavities having at least one cavity profile and configured to accept an emitter pixel structure of the LED or a sensor pixel structure of the image sensor;
depositing or epitaxially growing, in situ, layer by layer, a first plurality of layers of at least one emitter pixel structure completely filling in at least a first one of the plurality of cavities on the substrate, wherein the at least one emitter pixel structure is configured to have a plurality of exposed direct emitter contact areas on a same side and at a same height and wherein the exposed direct emitter contact areas are exposed areas of two or more different layers of the first plurality of layers; and
depositing or epitaxially growing, in situ, layer by layer, a second plurality of layers of at least one sensor pixel structure completely filling in at least a second one of the plurality of cavities on the substrate adjacent to the at least one emitter pixel structure, wherein the at least one sensor pixel structure is configured to have a plurality of exposed direct sensor contact areas on a same side and at a same height and wherein the exposed direct sensor contact areas are exposed areas of two or more different layers of the second plurality of layers.

18. The non-transitory, computer readable medium of claim 17, wherein the at least one cavity profile includes a first cavity profile for the at least one emitter pixel structure and a second cavity profile for the at least one sensor pixel structure.

19. The non-transitory, computer readable medium of claim 17, wherein the method further comprises:
forming the at least one emitter pixel structure using an atomic layer deposition (ALD) process, a chemical vapor deposition (CVD) process, or a molecular beam epitaxy (MBE) process; or
forming the at least one sensor pixel structure using an atomic layer deposition (ALD) process, a chemical vapor deposition (CVD) process, or a molecular beam epitaxy (MBE) process; and
crystallizing the at least one emitter pixel structure.

20. The non-transitory, computer readable medium of claim 17, wherein the method further comprises:
forming a mold layer on the substrate; and
forming the plurality of cavities on the substrate by etching the plurality of cavities in the mold layer; or
forming the plurality of cavities on the substrate by etching the plurality of cavities into a substrate material.

\* \* \* \* \*